United States Patent
Gibb et al.

(10) Patent No.: US 7,190,005 B2
(45) Date of Patent: Mar. 13, 2007

(54) GAN LED WITH SOLDERABLE BACKSIDE METAL

(75) Inventors: Shawn R. Gibb, Charlotte, NC (US); Robert F. Karlicek, Santa Maria, CA (US); Prosanto K. Mukerji, Phoenix, AZ (US); Hari S. Venugopalan, Somerset, NJ (US); Ivan Eliashevich, Maplewood, NJ (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 10/874,104

(22) Filed: Jun. 22, 2004

(65) Prior Publication Data

US 2004/0232439 A1   Nov. 25, 2004

Related U.S. Application Data

(62) Division of application No. 10/064,359, filed on Jul. 5, 2002, now Pat. No. 6,787,435.

(60) Provisional application No. 60/303,277, filed on Jul. 5, 2001.

(51) Int. Cl.
  *H01L 33/00* (2006.01)
  *H01L 21/76* (2006.01)

(52) U.S. Cl. ............... 257/103; 257/762; 257/E33.062

(58) Field of Classification Search ............... 257/103, 257/737, 751, 762, E33.068, E33.072
See application file for complete search history.

(56) References Cited

U.S. PATENT DOCUMENTS

| | | | |
|---|---|---|---|
| 4,829,321 A | | 5/1989 | Iizuka et al. |
| 5,369,289 A | | 11/1994 | Tamaki et al. |
| 5,939,735 A | | 8/1999 | Tsutsui et al. |
| 6,147,403 A | * | 11/2000 | Matschitsch et al. ....... 257/751 |
| 6,326,638 B1 | * | 12/2001 | Kamiyama et al. ........... 257/13 |
| 2001/0004534 A1 | * | 6/2001 | Carter-Coman et al. ...... 438/29 |
| 2002/0123164 A1 | * | 9/2002 | Slater et al. .................. 438/39 |

* cited by examiner

*Primary Examiner*—Thomas L. Dickey
(74) *Attorney, Agent, or Firm*—Fay Sharpe LLP

(57) ABSTRACT

A light-emitting element (24) is disclosed. A light emitting diode (LED) includes a sapphire substrate (26) having front and back sides (33, 35), and a plurality of semiconductor layers (28, 30, 32) deposited on the front side (33) of the sapphire substrate (26). The semiconductor layers (28, 30, 32) define a light-emitting structure that emits light responsive to an electrical input. A metallization stack (40) includes an adhesion layer (34) deposited on the back side (35) of the sapphire substrate (26), and a solderable layer (38) connected to the adhesion layer (34) such that the solderable layer (38) is secured to the sapphire substrate (26) by the adhesion layer (34). A support structure (42) is provided on which the LED is disposed. A solder bond (44) is arranged between the LED and the support structure (42). The solder bond (44) secures the LED to the support structure (42).

14 Claims, 3 Drawing Sheets

GAN LED WITH SOLDERABLE BACKSIDE METAL

This is a divisional of application Ser. No. 10/064,359 which has issued as U.S. Pat. No. 6,787,435.

This application claims the benefit of U.S. Provisional Application No. 60/303,277, entitled "GaN LED with Solderable Backside Metal", filed Jul. 5, 2001.

BACKGROUND OF THE INVENTION

The present invention relates to the lighting arts. It is particularly applicable to the fabrication of high-brightness gallium nitride (GaN) based light emitting diodes (LEDs) and LED arrays, and will be described with particular reference thereto. However, the invention also finds application in connection with other types of LEDs and in other LED applications.

With reference to FIG. 1, a conventional gallium nitride (GaN) based LED 10 includes thin layers of semiconductor material of two opposite conductivity types, typically referred to as p-type layers 12 and n-type layers 14. The layers 12, 14 are typically arranged in a stack, with one or more layers of n-type material in one part of the stack and one or more layers of p-type material at an opposite end of the stack. The LED 10 includes a light-emitting p-n junction region 16 arranged between the p-type layers 12 and the n-type layers 14. The various layers of the stack are deposited on a substrate 18, such as a sapphire substrate, by metal-organic vapor deposition (MOCVD), molecular beam epitaxy (MBE), or another deposition technique. After deposition, the substrate is typically cut or diced to form a plurality of LED packages. Each package includes one or more LEDs and a portion of the substrate 18.

In operation, an electric current passed through the LED 10 using electrical contacts 19 is carried principally by electrons in the n-type layer 14 and by electron vacancies or "holes" in the p-type layer 12. The electrons and holes move in opposite directions toward the junction layer 16, where they recombine with one another. Energy released by the electron-hole recombination is emitted from the LED 10 as light 20. As used herein, the term "light" includes visible light as well as electromagnetic radiation in the infrared and ultraviolet wavelength ranges. The wavelength of the emitted light 20 depends upon many factors, including the composition of the semiconductor materials, the structure of the junction 16, the presence or absence of impurities in the junction 16, and the like.

GaN-based LEDs, such as the LED 10 shown in FIG. 1, are typically fabricated on sapphire substrates 18, through which substrate 18 light can be extracted from a substrate back side 21. Alternatively, it is known to use a reflective layer 22 applied to the back side 21 of the LED 10. The reflective layer 22 reflects the emitted light 20 to produce reflected light 23 that contributes to a front-side light output and improves light extraction from the LED. Typically, the reflective contact is comprised of a single layer of aluminum or gold deposited on the back side 21 of the substrate 18. Such a configuration is illustrated in U.S. Pat. No. 5,939,735 issued to Tsutsui et al.

GaN-based LEDs are conventionally attached to a lead frame or a heat sink using a die-attach epoxy between the back surface 21 or the reflective layer 22 and the lead frame or heat sink. A single aluminum layer reflective contact on a GaN-based LED as proposed by Tsutsui only allows die attachment using an adhesive epoxy compound.

The use of epoxy to attach an LED die to a lead frame or heat sink causes problems. First, die-attach epoxies typically have a low thermal conductivity resulting in a thermal resistance between the active region of the LED and the heat sink of approximately 120° C./W. Such a high thermal resistance limits the amount of current and/or power which can safely be applied to the LED without encountering failure due to overheating or the like.

Second, epoxy compounds are subject to degradation when illuminated by a blue or ultraviolet light produced by the LED. This degradation is more pronounced at the elevated temperatures typically encountered in high-brightness GaN LED operation.

In view of the disadvantages of epoxies for connecting LED chips to a heat sink, lead frame or the like, it would be preferable to employ a solder connection. Solder connections typically exhibit a low thermal resistance of about 20° C./W and possibly as low as 5° C./W. Furthermore, there are several package configurations which are particularly well-suited for soldering of the LED. Generally, reflective layers and/or contacts such as those proposed by Tsutsui and/or shown in FIG. 1 are incompatible with soldering because the aluminum does not provide a good surface for solder bonding. Similarly, a gold reflective layer adheres weakly to the sapphire substrate, and so soldering to a gold reflective layer typically results in delaminating of the gold layer from the substrate.

The present invention contemplates an improved backside metallization and method for forming the same that overcomes the above-mentioned limitations and others.

BRIEF SUMMARY OF THE INVENTION

In accordance with one embodiment of the present invention, A light-emitting diode is disclosed. A stack of gallium nitride based layers is configured to emit light responsive to an electrical input. A light-transmissive substrate has a front side and a back side. The gallium nitride based layer stack is disposed on the front side. The substrate is light-transmissive for the light produced by the gallium nitride based layer stack. A metallization stack includes a solderable layer formed on the back side of said substrate. The metallization stack (i) reflects a portion of the light produced by the gallium nitride based layer stack toward the front side of the substrate, and (ii) attaches the light-emitting diode to an associated support by a soldered bond.

In accordance with another embodiment of the present invention, a light-emitting element is disclosed. A light emitting diode (LED) includes a sapphire substrate having front and back sides, and a plurality of semiconductor layers deposited on the front side of the sapphire substrate. The semiconductor layers define a light-emitting structure that emits light responsive to an electrical input. A metallization stack includes an adhesion layer deposited on the back side of the sapphire substrate, and a solderable layer connected to the adhesion layer such that the solderable layer is secured to the sapphire substrate by the adhesion layer. A support structure is provided on which the LED is disposed. A solder bond is arranged between the LED and the support structure. The solder bond secures the LED to the support structure.

In accordance with yet another embodiment of the present invention, A method is provided for fabricating a light-emitting element. Semiconducting layers are deposited on a front side of an electrically insulating substrate wafer such that the semiconducting layers define a light-emissive region that emits light responsive to an electrical current flowing therethrough. A metallic bonding layer is deposited on a back side of the substrate. Electrical contacts are formed adjacent to selected semiconducting layers on the front side of the substrate. The metallic bonding layer is soldered to a support structure. The electrical contacts are connected to electrical inputs that supply the electrical current to the light-emissive region.

In accordance with still yet another embodiment of the present invention, a light emitting diode (LED) is disclosed, including a substrate and a stack of semiconductor layers arranged on a first side of the substrate. The stack of semiconductor layers is configured to emit light responsive to an electrical input. A metallization stack is arranged on a second side of the substrate opposite the first side. The metallization stack including a plurality of layers, said layers including at least: (i) a first layer formed from a first material that adheres to the substrate, and (ii) a second layer formed from a second material that is suitable for solder bonding. The second material is different from the first material.

Numerous advantages and benefits of the present invention will become apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention. Further, it is to be appreciated that the LED drawings are not to scale.

DETAILED DESCRIPTION OF THE INVENTION

Figure 1:
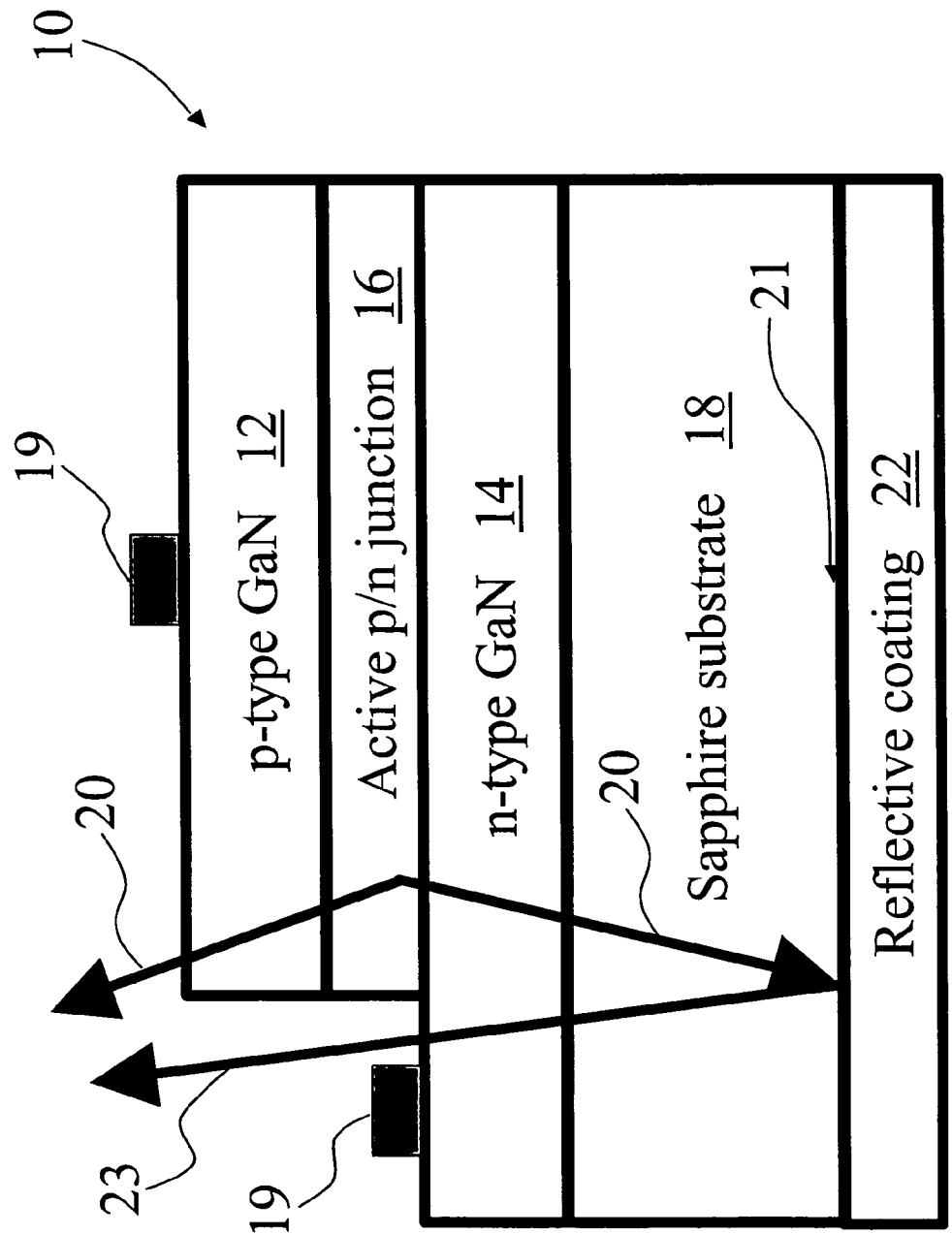
FIG. 1 shows a front elevation view of a conventional GaN-based LED.
Figure 2:
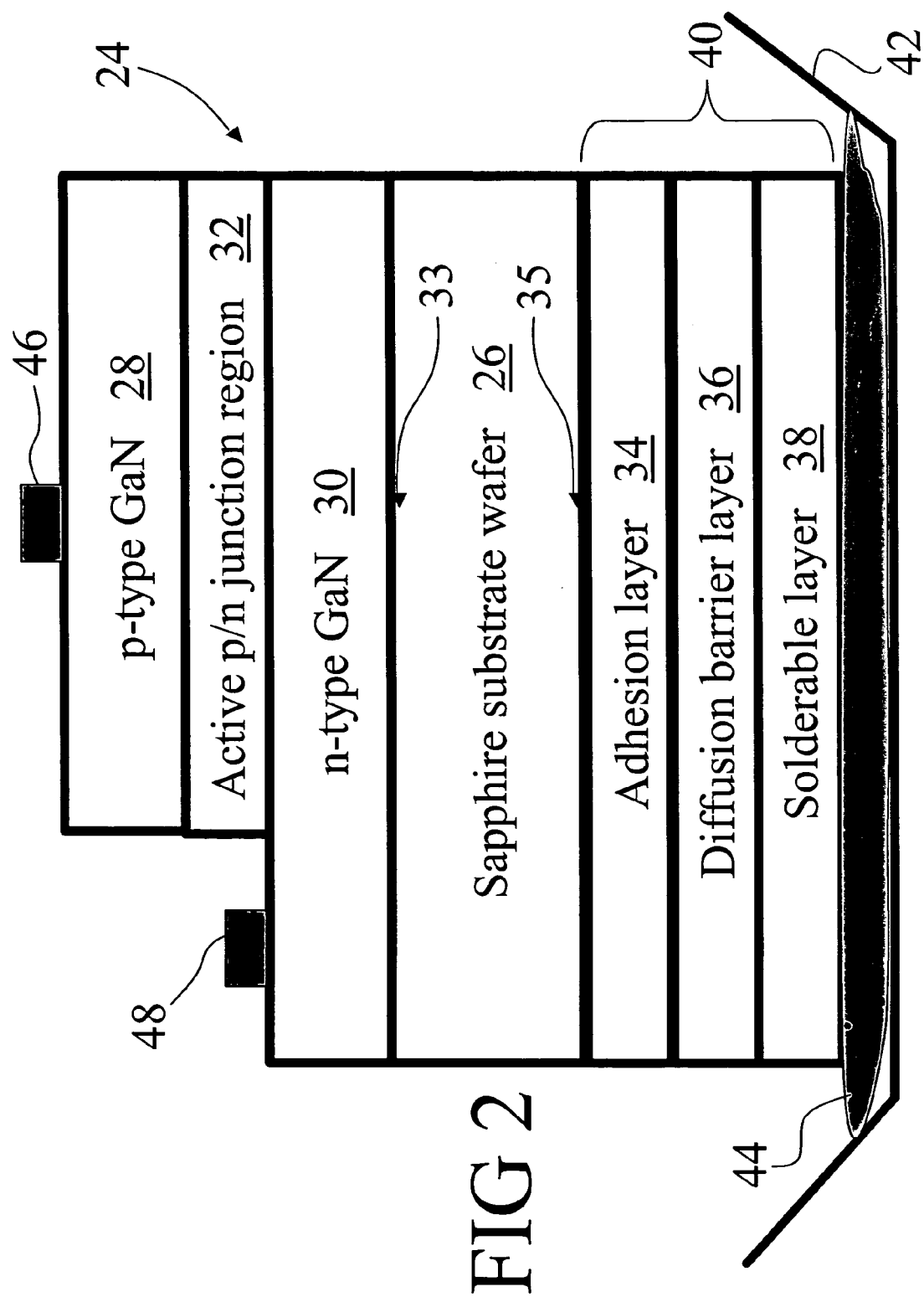
FIG. 2 shows a front elevation view of a GaN-based LED having a backside metallization in accordance with an embodiment of the present invention.

With reference to FIG. 2, a gallium nitride (GaN) based light emitting element 24 includes a substrate 26 of sapphire, GaN, silicon carbide (SiC), or another material and an LED including one or more p-type GaN layers 28 and one or more n-type GaN layers 30 arranged thereon. The LED shown in FIG. 2 has a p-on-n configuration in which the n-type layer or layers 30 resides between the p-type layer or layers 28 and the substrate 26.

Alternatively, an n-on-p configuration (not shown) has one or more p-type layers residing between one or more n-type layers and a substrate. Optionally, either LED configuration may be employed. Furthermore, the layers 28, 30 can be formed from gallium nitride (GaN), aluminum nitride (AlN), indium nitride (InN), or ternary or quaternary alloys thereof such as aluminum gallium nitride ($Al_xGa_{1-x}N$) or indium gallium nitride ($In_xGa_{1-x}N$). It is also contemplated to employ an alloy of all three binary compounds AlN, GaN, and InN ($Al_xIn_yGa_{1-x-y}N$). Instead of a nitride-based semiconductor, other semiconductors such as silicon carbide, a phosphide-based semiconductor, or the like can also be used.

Whether a p-on-n or an n-on-p configuration is used, an active p/n junction region 32 is arranged between the n-type and p-type layers 28, 30. In one suitable embodiment, the n-type and p-type layers 28, 30 are arranged in direct contact, and the active p/n junction region 32 is defined by a region of charge transfer that takes place at the interface of the layers 28, 30 due to the difference in conductivity type. In another suitable embodiment, the active p/n junction region 32 includes one or more quantum wells formed by low bandgap material such as indium gallium nitride ($In_xGa_{1-x}N$) or indium nitride (InN). Under a forward bias, holes and electrons enter the active p/n junction region 32 from the p-type and n-type layers 28, 30 and radiatively recombine within the active p/n junction region 32 to produce light.

The semiconducting layers 28, 30, 32 are arranged on a frontside 33 of the substrate 26. An adhesion layer 34 is located adjacent to a backside 35 of the substrate 26. The adhesion layer 34 is metallic, and is preferably made of silver, aluminum, or rhodium. The adhesion layer 34 is suitably in a range of 30 nanometers to 1 micron in thickness, and is preferably about 200 nanometers.

A diffusion barrier 36 is deposited on the adhesion layer 34. The diffusion barrier 36 is also comprised of metal, and is preferably a titanium, nickel, or platinum layer, or an alloy thereof. In addition, the diffusion barrier can be made up of two or more layers of different materials, such as a titanium/nickel stacked diffusion barrier. The diffusion barrier layer 36 is suitably in a range of 10 nanometers to 100 nanometers for a platinum or titanium single layer, and is preferably about 50 nanometers. For a nickel single layer, the diffusion barrier 36 is suitably in a range of 100 nanometers to 1 micron, and is preferably about 500 nanometers.

A metal-bondable or solderable layer 38 is deposited on the diffusion barrier 36. The solderable contact 38 is comprised of metal, preferably silver, gold, or tin. The thickness of the solderable layer 38 is suitably in a range of 100 nanometers to 2 microns, and is preferably a gold layer of around 100 nanometers.

The adhesion layer 34, the diffusion barrier 36, and the solderable layer 38 together form a metallization stack 40 suitable for soldering to a heat sink, lead frame, or the like. The diffusion barrier 36 prevents undesirable alloying or intermetallic compound formation between the adhesion layer 34 (e.g., aluminum) and the solderable layer 38 (e.g., gold). The diffusion barrier 36 prevents intermixing of different metals that results in the formation of unstable intermetallics between the adhesion layer 34 and the solderable layer 38.

In a preferred embodiment, the metallization stack 40 is annealed after deposition to improve adhesion and relieve stress. A suitable annealing schedule includes a 5 minute anneal at between 200° C. and 400° C. in a nitrogen or air ambient. Those skilled in the art can modify the annealing schedule to accommodate different metals or thicknesses, to reduce or prevent thermal degradation of the light emitting element 24 during the anneal, and the like.

The adhesion layer 34 provides a strong attachment or bonding of the metallization stack 40 to the substrate 26. In addition, the adhesion layer 34 acts as a reflective layer that reflects light emitted by the active p/n junction region 32 and increasing the light emission of the LED.

The solderable layer 38 provides a suitable surface for soldering to an associated support 42, such as a heat sink, lead frame, or the like, by a solder bond 44 without compromising the LED. Moreover, the solderable layer 38 provides a strong mechanical attachment and good thermal conductance between the substrate 26 and the associated support 42.

The metallic stack 40 can be constructed from various combinations of aluminum, titanium, nickel, platinum, silver, and gold. The choices of metals depends upon the type of substrate, and the compatibility of the layers 34, 36, 38. For a sapphire substrate 26, a preferred embodiment of the metal stack 40 includes: an adhesion layer 34 of aluminum about 200 nanometers thick; a diffusion barrier layer 36 of a platinum/nickel bi-layer including a platinum thickness of about 50 nanometers and a nickel thickness of about 500 nanometers deposited onto the platinum; and, a solderable layer 38 of gold about 100 nanometers thick.

In another suitable embodiment for a sapphire substrate 26, the metal stack 40 includes: an adhesion layer 34 of silver about 200 nanometers thick; a diffusion barrier layer 36 of a titanium/nickel bi-layer including a titanium thickness of about 50 nanometers and a nickel thickness of about 500 nanometers deposited onto the titanium; and, a solderable layer 38 of gold about 100 nanometers thick. The use of a titanium/nickel barrier layer 36 is particularly advantageous because the titanium provides for better adhesion to the silver adhesion layer 34.

The metallization stack 40 is preferably directly deposited onto the sapphire substrate 26 in wafer form during the LED manufacturing process. The various layers of the metallization stack 40 are suitably deposited onto the sapphire wafer by evaporation, sputtering, electroplating, stencil printing, screen-printing, or other deposition techniques or combinations of techniques. It is to be understood that the deposition of the layers 34, 36, 38 are not necessarily all performed using the same deposition technique. For example, evaporation can be used to deposit the adhesion layer 34, diffusion barrier layer 36, and a nucleating deposit of the solderable layer 38, followed by an electroplating of the bulk of the solderable layer 38.

The wafer is suitably lithographically processed to define LED mesas. Each mesa has a first contact 46 formed on top of and contacting the p-type GaN layer 28, and a second contact 48 contacting the n-type GaN layer 30 in an area which has been etched away to form the mesa. Alternatively, instead of forming a mesa, contact openings for accessing the n-type GaN layer 30 can be etched through the p-type GaN layer 28 and the active p/n junction region 32.

In a preferred embodiment for a GaN LED, the lithographic mesa definition and contacts 46, 48 formation is performed, and the wafer is thinned in preparation for dicing, prior to deposition of the metallization stack 40, because the contacts processing temperature is typically substantially higher than the metallization stack 40 deposition and annealing temperatures, and can thermally damage the stack 40. However, those skilled in the art can alter the order of processing to accommodate particular situations. For example, if the contacts 46, 48 are thermally sensitive, it may be preferable to deposit the metallization stack 40 prior to formation of the contacts 46, 48.

The wafer is diced or separated into individual chips which are immediately ready for placement onto a heat sink or lead frame by soldering to the metallization stack 40 without further processing. It is not necessary to align a solder with a chip after the LED manufacturing process. Accordingly, each diced chip is readily and easily attachable and inexpensive compared to traditional methods of attaching LED chips to heat sinks or lead frames.

In a preferred approach, the solder is stenciled onto the heat sink or lead frame and the LED chips arranged on the solder. The stenciled solder is arranged in pads substantially conforming with the size and shape of the LED chips, and the solder is reflowed after chip placement. Alternatively, the solder can be deposited onto the metallization stack 40, e.g. during the formation of the stack 40, and the LED chip with solder applied is placed onto the heat sink or lead frame and the solder reflowed. Using either approach, it is advantageously unnecessary to precisely align the chip with the solder because the reflow effectuates a self-alignment of the LED chip with the solder pad.

Figure 3:
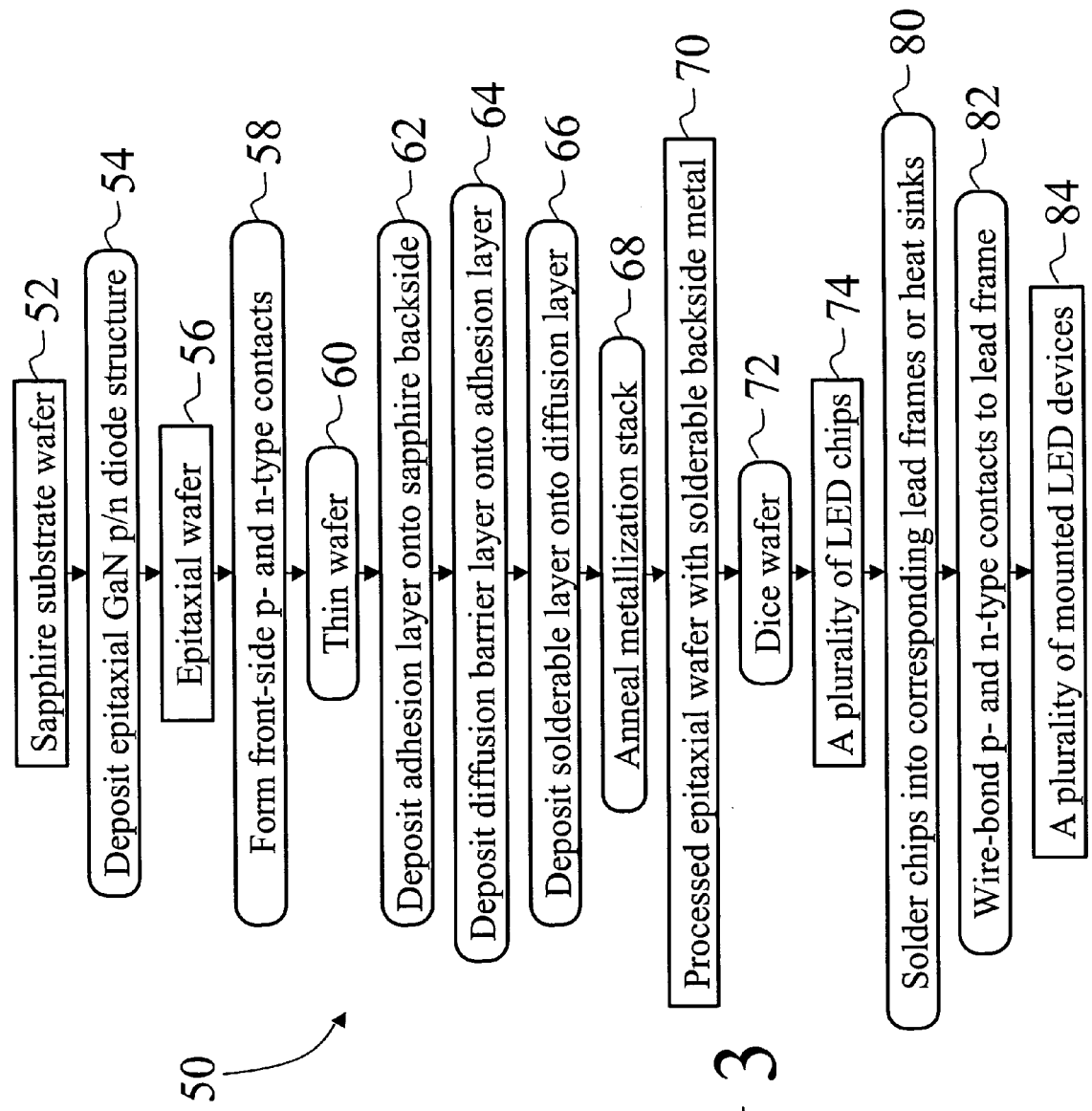
FIG. 3 shows a method for fabricating a GaN-based LED in accordance with an embodiment of the present invention.

With continuing reference to FIG. 2 and with further reference to FIG. 3, a suitable fabrication method 50 for fabricating LED chips starts with a substrate wafer 52, such as a sapphire wafer. The substrate wafer 52 is preferably large enough to fabricate a large number of LEDs diced therefrom. In an epitaxial deposition step 54, semiconductor layers 28, 30, 32 are deposited onto the substrate wafer 52 to form an epitaxial wafer 56. For a GaN-based LED, layers of binary, ternary, or quaternary alloys of GaN, InN, and AlN are suitably deposited epitaxially using metalorganic chemical vapor deposition (MOCVD), molecular beam epitaxy (MBE), or the like.

The substrate wafer 52 is preferably processed prior to epitaxial deposition using typical wafer cleaning or other pre-treatment such as chemical cleaning, in-situ thermal degassing and surface oxide removal, and the like. Similarly, suitable epitaxial crystal growth techniques such as employment of low temperature buffers or nucleation layers are optionally employed during the epitaxial growth step 54. Typically, the conductivity types of the p-type and n-type layers 28, 30 are established by introducing selected dopants during the epitaxial growth 54. Alternatively or additionally, the doping of the layers is modified after the deposition using dopant diffusion or other techniques.

With continuing reference to FIGS. 2 and 3, the epitaxial 56 wafer is processed to form the front side p- and n-type electrical contacts 46, 48 in a step 58. These contacts are preferably fabricated using a sequence of lithographic patterning steps, insulator deposition steps, and contact material deposition steps that define p-type and n-type contact pads 46, 48 that electrically communicate with the p-type and n-type layers 28, 30, respectively, either directly or through contact vias. In one suitable lithographic process, the contacts formation step 58 includes lithographically defining mesas including the topmost layer (e.g., the p-type GaN layer 28 in FIG. 2) and the active region 32, and an etched region around the mesa where the buried layer (e.g., the n-type GaN layer 30 in FIG. 2) is exposed for contacting. Alternatively, contact via openings can be etched through the topmost layer 28 and the active region 32 to electrically access the buried layer 30.

Once the lithographic processing and contract formation step 58 is completed, the wafer is preferably thinned from the backside. As is known to those skilled in the art, backside thinning advantageously helps in subsequent device dicing and improves device yield. Because the thinned wafer is more fragile than the unthinned wafer, the contact formation processing step 58 which typically includes substantial wafer manipulation is preferably performed prior to wafer thinning. However, it is also contemplated to thin the wafer prior to the contact formation 58, or even prior to the epitaxial growth 54. For dicing using mechanical scribing, the sapphire substrate is preferably thinned to a reduced thickness of about 4 mils. For laser dicing, a larger final thickness is preferable. For large-area devices and/or initially thin substrate wafers, it is also contemplated to omit the wafer thinning step 60.

With continuing reference to FIGS. 2 and 3, the backside metallization 40 is preferably applied to the thinned wafer backside in metallization steps 62, 64, 66, and annealed in a step 68, to produce a processed epitaxial wafer with solderable backside metal 70. The adhesion layer 34 is first deposited in a step 62, followed by deposition of the diffusion barrier layer 36 onto the adhesion layer 34 in a step 64, and deposition of the solderable layer 38 onto the diffusion barrier layer 36 in a step 66, to form a processed epitaxial wafer with solderable backside metal 68. The metal deposition steps 62, 64, 66 are suitably performed by a single deposition technique in a single processing session. For example, a thermal- or electron beam-evaporator having a plurality of source material crucibles can be used to successively perform the layer deposition steps 62, 64, 66 in a single session.

Alternatively, the deposition steps 62, 64, 66 can be performed in two or more separate sessions. For example, the adhesion and diffusion barrier layers 34, 36 are typically thin compared with the solderable layer 38, and so a vacuum evaporator which deposits material slowly but in a clean high-vacuum environment is suitably employed to deposit the thin adhesion and diffusion barrier layers 34, 36 in the steps 62, 64. Subsequently, the wafer is transferred to an electroplating apparatus capable of high deposition rates at a lower vacuum grade to apply the thick solderable layer 38 in the step 66. In such a deposition sequence, it is also contemplated to deposit a thin portion of the solderable layer 38 in the vacuum evaporator to protect the surface and establish the interface between the diffusion barrier and solderable layers 36, 38 in the high-vacuum environment.

Those skilled in the art can select other deposition techniques and sequences which are suitable for the thermal stability of the various metallic layers and interfaces, the types of metals being deposited, and the like. In a preferred embodiment, the metallization stack 40 is annealed in the step 68 to improve adhesion and relieve stress. A suitable annealing schedule for a metal stack on a sapphire substrate is 5 minutes at about 200° C. to 400° C. in a nitrogen or air ambient. Those skilled in the art can optimize the annealing schedule for selected metals and layer thicknesses, and may optionally omit the annealing step 68 altogether if the layers adhere suitably well as-deposited.

In the method 50, the metallization stack is applied after the epitaxial growth step 54, since the epitaxial growth temperature is typically substantially greater than the temperatures employed in the metal deposition steps 62, 64, 66. If the metal stack 40 is deposited before the epitaxial semiconductor deposition 54, the high temperatures during epitaxy could for example drive solid state diffusion between the adhesion layer 34 and the solderable layer 38 in spite of the presence of the diffusion barrier layer 36. Furthermore, the metal deposition steps 62, 64, 66 should be performed after the wafer thinning step 60, which as discussed previously is preferably delayed as long as possible to minimize yield reductions due to manipulation of the thinned wafer.

However, if the metal deposition steps 60, 62, 64 employ higher temperatures than the epitaxial semiconductor deposition step 54 or could otherwise adversely affect the semiconductor layers, the epitaxial deposition 54 is optionally performed after the thinning step 60 and the metal deposition steps 62, 64, 66. Alternatively, the epitaxy 54 can be interposed between metal deposition steps 62, 64 or between metal deposition steps 64, 66.

Furthermore, the semiconductor epitaxy step 54 can be performed in multiple sessions, with the thinning and/or metallization steps 60, 62, 64, 66 or other wafer-level processing performed in-between. Those skilled in the art can select a suitable temporal sequence for the method 50 or portions thereof which optimally accounts for the thermal stability of the various layers and layer interfaces, concerns about cross-contamination of the layers, and the like.

In the described embodiment of a GaN-based LED on a sapphire substrate wafer, the substrate wafer 52 is electrically insulative sapphire. In this case, both p- and n-type layers 28, 30 are typically contacted from the frontside, which for the p-on-n configuration of FIG. 2 requires lithographically defining access through the p-type GaN 28 and the active region 32 to the n-type GaN layer 30, e.g. by etching mesas or contact openings. However, for other LEDs in which a conductive substrate wafer is employed, the backside metal stack 40 is suitably used as a contact for the buried layer proximate thereto. Of course, in this case the conductivity type of the conductive substrate should match the conductivity type of the adjacent layer. However, due to the large contacting area between the backside metal stack 40 and the substrate, the specific contact resistance can be substantial while still providing a low total contact resistance.

The wafer is diced in a step 72 to separate individual LED chips 74. The dicing is suitably performed using mechanical scribing or a laser saw, and preferably employs a translation stage to automate the dicing. The wafer thinning step 60 advantageously aids in fracturing of the substrate to improve device yield during the dicing step 72. Each individual LED die has front side p-type and n-type contacts 46, 48 and a back side including the metal stack 40.

In a step 80, each individual LED die is soldered onto the lead frame, a heat sink, printed circuit board, or other associated support 42 which optionally also provides thermal dissipation for the LED. The sapphire substrate 26, the deposited metal stack 40, and the solder bond 44 provides a thermally conductive path from the heat-generating semiconductor layers 28, 30, 32 to the associated support 42, e.g. a heat sink.

As described previously, in a preferred approach the solder is applied the heat sink or to the solderable layer 38, the LED die is placed approximately into place on the associated support 42, and the solder is reflowed, e.g. by application of a small amount of heating, to effectuate the solder bonding and simultaneous self-alignment of the LED die on the solder bonding pad of the associated support 42. This ensures that the LED is precisely aligned with the solder pad to ensure a large area of contact for heat transfer.

Electrical contacting of the n-type and p-type bonding pads to an electrical power source is established in a step 82, e.g. using wire bonding, to produce a plurality of mounted LED devices 84.

Although in the method 50 each LED die is described as being soldered to a corresponding support 42, it is also contemplated to solder a plurality of LED dice onto a single support. For an LED array, a large number of LED chips are suitably soldered onto a single printed circuit board (pcb) that includes conductive traces to which the p-type and n-type contact pads of the LED chips are wire-bonded in the step 82 to power the LED array.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light emitting diode comprising:
    a stack of gallium nitride based layers configured to emit light responsive to an electrical input;
    a light-transmissive substrate having a front side and a back side, the gallium nitride based layer stack disposed on the front side, the substrate being light-transmissive for the light produced by the gallium nitride based layer stack; and a metallization stack including a solderable layer formed on the back side of said substrate, the metallization stack (i) reflecting a portion of the light produced by the gallium nitride based layer stack toward the front side of the substrate, and (ii) attaching the light transmissive substrate to an associated support by a soldered bond, the metallization stack further including an adhesion layer directly adjacent to the back side of the substrate and secured to the back side of the substrate and secured to the solderable layer to effectuate a securing of the solderable layer to the substrate, and first and second diffusion barrier layers arranged between the adhesion layer and the solderable layer that substantially prevent intermixing between the adhesion layer and the solderable layer, the first diffusion barrier layer secured to the adhesion layer and the second diffusion barrier layer secured to the solderable layer.

2. The light emitting diode as set forth in claim 1, wherein the adhesion layer is comprised of a material selected from a group consisting of silver, aluminum, and rhodium.

3. The light emitting diode as set forth in claim 1, wherein:
the adhesion layer is a silver layer;
the first diffusion barrier layer is a titanium layer; and
the second diffusion barrier layer is a nickel layer.

4. The light emitting diode as set forth in claim 1, wherein:
the adhesion layer is an aluminum layer;
the first diffusion barrier layer is a platinum layer; and
the second diffusion barrier layer is a nickel layer.

5. The light emitting diode as set forth in claim 1, wherein the solderable layer is selected from a group consisting of a gold layer and a silver layer.

6. A light-emitting element comprising:
a light emitting diode (LED) including a sapphire substrate having front and back sides, and a plurality of semiconductor layers deposited on the front side of the sapphire substrate, the semiconductor layers defining a light-emitting structure that emits light responsive to an electrical input;
a metallization stack including an adhesion layer deposited on the back side of the sapphire substrate, a first diffusion barrier layer disposed on the adhesion layer and a second diffusion barrier layer disposed on the first diffusion barrier layer, and a solderable layer disposed on the second diffusion barrier layer such that the solderable layer is secured to the sapphire substrate, the first and second diffusion barrier layers substantially preventing intermixing between the adhesion layer and the solderable layer;
a support structure on which the LED is disposed; and
a solder bond between the LED and the support structure and connected with the solderable layer that secures the LED to the support structure.

7. The light emitting element as set forth in claim 6, wherein the support structure is a lead frame or a heat sink.

8. The light emitting element as set forth in claim 6, wherein:
the adhesion layer is selected from a group consisting of a silver layer and a rhodium layer.

9. The light emitting element as set forth in claim 6, further including:
front-side p-type and n-type contacts by which the electrical input is applied to the semiconductor layers defining the light-emitting structure.

10. The light emitting element as set forth in claim 6, wherein the plurality of semiconductor layers are selected from a group consisting of GaN, AlN, InN, and alloys thereof.

11. A light emitting element comprising:
a light emitting diode (LED) including a sapphire substrate having front and back sides, and a plurality of semiconductor layers deposited on the front side of the sapphire substrate, the semiconductor layers defining a light-emitting structure that emits light responsive to an electrical input;
a metallization stack including an adhesion layer deposited on the back side of the sapphire substrate, a solderable layer connected to the adhesion layer such that the solderable layer is secured to the sapphire substrate by the adhesion layer, and a diffusion blocking layer disposed between the adhesion layer and the solderable layer that substantially reduces intermixing between the adhesion layer and the solderable layer, wherein the adhesion layer, diffusion blocking layer, and solderable layer are selected from a group consisting of:
(i) an aluminum adhesion layer and a gold solderable layer with the diffusion blocking layer including platinum and nickel, and
(ii) a silver adhesion layer and a gold solderable layer with the diffusion blocking layer including titanium and nickel;
a support structure on which the LED is disposed; and
a solder bond between the LED and the support structure that secures the LED to the support structure.

12. The light emitting element as set forth in claim 11, wherein:
the adhesion layer is an aluminum layer, the diffusion blocking layer includes platinum and nickel, and the solderable layer is a gold layer.

13. The light emitting element as set forth in claim 11, wherein:
the adhesion layer is a silver layer, the diffusion blocking layer includes titanium and nickel, and the solderable layer is a gold layer.

14. A light emitting element comprising:
a stack of gallium nitride based layers configured to emit light responsive to an electrical input;
a light-transmissive substrate having a front side and a back side, the gallium nitride based layer stack disposed on the front side, the substrate being light-transmissive for the light produced by the gallium nitride based layer stack; and
a metallization stack formed on the back side of the substrate, the metallization stack configured to reflect a portion of the light produced by the gallium nitride based layer stack toward the front side of the substrate and further configured to enable soldering of the substrate, the metallization stack including:
a solderable layer,
an adhesion layer disposed between the back side of the substrate and the solderable layer and providing adhesion of the metallization stack to the back side of the substrate, and
first and second diffusion barrier layers of different materials disposed between the adhesion layer and the solderable layer to substantially prevent intermixing between the adhesion layer and the solderable layer.

* * * * *